United States Patent
Ni et al.

(10) Patent No.: US 9,799,588 B2
(45) Date of Patent: Oct. 24, 2017

(54) CHIP PACKAGE AND MANUFACTURING METHOD THEREOF

(71) Applicant: XINTEC INC., Jhongli, Taoyuan County (TW)

(72) Inventors: Ching-Yu Ni, Hsinchu (TW); Chia-Ming Cheng, New Taipei (TW); Nan-Chun Lin, New Taipei (TW)

(73) Assignee: XINTEC INC., Taoyuan (TW)

( * ) Notice: Subject to any disclaimer, the term of this patent is extended or adjusted under 35 U.S.C. 154(b) by 0 days.

(21) Appl. No.: 14/341,573

(22) Filed: Jul. 25, 2014

(65) Prior Publication Data

US 2014/0332985 A1    Nov. 13, 2014

Related U.S. Application Data

(62) Division of application No. 13/958,398, filed on Aug. 2, 2013, now Pat. No. 8,822,325, which is a division of application No. 12/958,329, filed on Dec. 1, 2010, now abandoned.

(60) Provisional application No. 61/265,708, filed on Dec. 1, 2009.

(51) Int. Cl.
  *H01L 23/498* (2006.01)
  *H01L 23/31* (2006.01)
  *H01L 23/00* (2006.01)
  *H01L 21/78* (2006.01)

(52) U.S. Cl.
  CPC ............ *H01L 23/498* (2013.01); *H01L 21/78* (2013.01); *H01L 23/3114* (2013.01); *H01L 23/3192* (2013.01); *H01L 24/06* (2013.01); *H01L 2224/05624* (2013.01); *H01L 2224/05647* (2013.01); *H01L 2924/014* (2013.01); *H01L 2924/01013* (2013.01); *H01L 2924/01014* (2013.01); *H01L 2924/01029* (2013.01); *H01L 2924/01033* (2013.01); *H01L 2924/01082* (2013.01); *H01L 2924/05042* (2013.01); *H01L 2924/14* (2013.01); *H01L 2924/1461* (2013.01);

(Continued)

(58) Field of Classification Search
  CPC ...................................... H01L 23/498
  USPC .... 257/786, 692, E21.506, E23.02; 438/612, 438/114, 745, 15
  See application file for complete search history.

(56) References Cited

U.S. PATENT DOCUMENTS 3,956,527 A * 5/1976 Magdo et al. ................ 438/405
5,315,153 A * 5/1994 Nagai et al. .................. 257/701
5,818,560 A * 10/1998 Kouno et al. ................ 349/129

(Continued)

*Primary Examiner* — Sheng Zhu
(74) *Attorney, Agent, or Firm* — Liu & Liu

(57) ABSTRACT

A chip package and a fabrication method thereof are provided according to an embodiment of the invention. The chip package includes a semiconductor substrate containing a chip and having a device area and a peripheral bonding pad area. A plurality of conductive pads is disposed at the peripheral bonding pad area and a passivation layer is formed over the semiconductor substrate to expose the conductive pads. An insulating protective layer is formed on the passivation layer at the device area. A packaging layer is disposed over the insulating protective layer to expose the conductive pads and the passivation layer at the peripheral bonding pad area. The method includes forming an insulating protective layer to cover a plurality of conductive pads during a cutting process and removing the insulating protective layer on the conductive pads through an opening of a packaging layer.

13 Claims, 4 Drawing Sheets

(52) U.S. Cl.
CPC ............... *H01L 2924/15788* (2013.01); *H01L 2924/16195* (2013.01); *H01L 2924/16235* (2013.01)

(56) References Cited

U.S. PATENT DOCUMENTS

| | | | |
|---|---|---|---|
| 5,976,907 A * | 11/1999 | Shigeta et al. | 438/65 |
| 6,169,592 B1 * | 1/2001 | Choi | 349/124 |
| 6,232,032 B1 * | 5/2001 | Nunomura et al. | 430/191 |
| 6,911,386 B1 * | 6/2005 | Lee et al. | 438/612 |
| 7,037,747 B2 * | 5/2006 | Omori | 438/67 |
| 7,123,325 B2 * | 10/2006 | Maeda et al. | 349/113 |
| 2005/0052592 A1 * | 3/2005 | Fukuhara | 349/100 |
| 2009/0231534 A1 * | 9/2009 | Morita | 349/153 |

* cited by examiner

CHIP PACKAGE AND MANUFACTURING METHOD THEREOF

CROSS REFERENCE TO RELATED APPLICATIONS

This application is a Divisional of U.S. application Ser. No. 13/958,398, filed on Aug. 2, 2013, which is a Divisional of U.S. application Ser. No. 12/958,329, filed on Dec. 1, 2010, which claims the benefit of U.S. Provisional Application No. 61/265,708, filed on Dec. 1, 2009, the entirety of which are incorporated by reference herein.

BACKGROUND OF THE INVENTION

Field of the Invention

The present invention relates to a chip package, and in particular relates to a chip package which can protect conductive pads from damage during a cutting process and a redistribution stack layer and a fabrication method thereof.

Description of the Related Art

Wafer level packaging technology has been developed for packaging chips. After a wafer level package is completed, a cutting process is performed between chips to separate the chips from each other.

However, when using a cutter to form an opening between the chips in the cutting process, a lot of chipping is produced. The chippings damage and scratch bonding pads of the chip during the cutting process, such that the reliability of wire bonding of the chip package is reduced following subsequent processes and the electrical property of the conventional chip package is poor.

Thus, a chip package which can mitigate the above mentioned problems and prevent the conductive pads of chips from damage during a cutting process is desired.

BRIEF SUMMARY OF THE INVENTION

According to an illustrative embodiment, a chip package is provided. The chip package comprises a semiconductor substrate containing a chip, having a device area and a peripheral bonding pad area. A plurality of conductive pads is disposed at the peripheral bonding pad area. A chip passivation layer is disposed over the semiconductor substrate, exposing the conductive pads. An insulating protective layer is disposed over the device area and a packaging layer is disposed over the insulating protective layer, exposing the conductive pads.

According to another illustrative embodiment, a method for fabricating a chip package is provided. The method comprises providing a semiconductor wafer containing a plurality of device areas and a peripheral bonding pad area disposed between any two adjacent device areas, wherein the peripheral bonding pad area includes a plurality of conductive pads, and a chip passivation layer covering the semiconductor wafer, exposing the conductive pads. An insulating protective layer is formed on the chip passivation layer, covering the conductive pads. A packaging layer is provided and the semiconductor wafer is bonded to the packaging layer. The packaging layer is patterned to form a plurality of openings to expose the insulating protective layer at the peripheral bonding pad area. Then, the insulating protective layer at the peripheral bonding pad area is removed to expose the conductive pads by using the packaging layer as a hard mask.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1A:
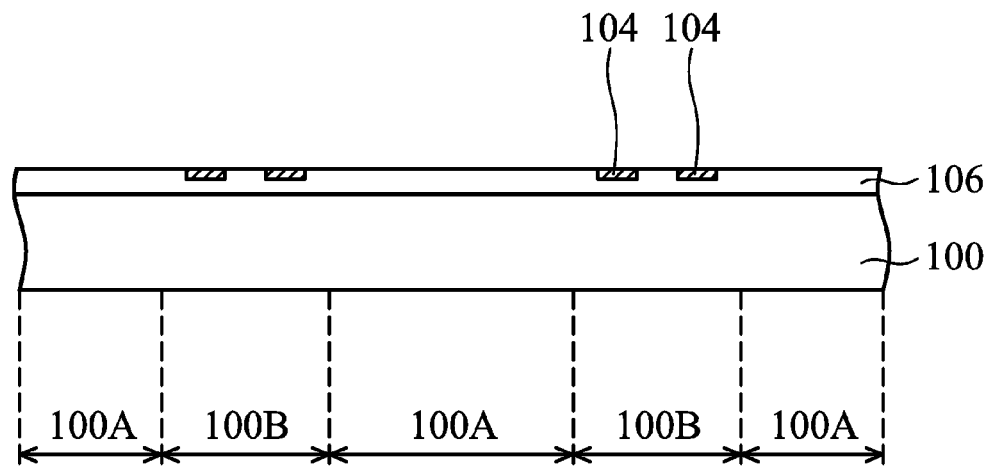
FIGS. 1A-1F are illustrative cross sections showing the steps for fabricating a chip package according to an embodiment of the invention.

The following description is of a mode for carrying out the invention. This description is made for the purpose of illustrating the general principles of the invention and should not be taken in a limiting sense. The scope of the invention is best determined by reference to the appended claims. Wherever possible, the same reference numbers are used in the drawings and the descriptions to refer the same or like parts. In the drawings, the size of some of the elements may be exaggerated and not drawn to scale for illustrative purposes. The dimensions and the relative dimensions do not correspond to actual dimensions to practice of the invention. Further, parts of the elements in the drawings are illustrated by the following description. Some elements not shown in the drawings are known by one skilled the art.

The embodiments of chip packages of the invention and fabrication methods thereof are illustrated by embodiments of fabricating image sensor packages in the following description. However, it should be appreciated that the invention may also be applied to forming other semiconductor chip packages. Therefore, the packages of the embodiments of the invention may be applied to active or passive devices, or electronic components with digital or analog circuits, such as optoelectronic devices, micro electro mechanical systems (MEMS), micro fluidic systems, and physical sensors for detecting heat, light, or pressure. Particularly, a wafer scale package (WSP) process may be applied to package semiconductor chips, such as image sensors, solar cells, RF circuits, accelerators, gyroscopes, micro actuators, surface acoustic wave devices, pressure sensors, and ink printer heads.

The wafer level packaging process herein mainly means that after the packaging process is accomplished during a wafer stage, a wafer with chips is cut to obtain separate independent packages. However, in an embodiment of the invention, separate independent chips may be redistributed overlying a supporting wafer and then be packaged, which may also be referred to as a wafer level packaging process. In addition, the wafer level packaging process may also be adapted to form chip packages of multi-layered integrated circuit devices by stacking a plurality of wafers having integrated circuits together.

An embodiment of the invention provides a chip packages and a fabrication method thereof. After a wafer level package of the above mentioned devices is completed and the devices are separated from each other to form separate independent chip packages by a cutting process, the conductive pads of the chip packages are protected to prevent from damage by residues produced from the cutting process, or scratching the conductive pads.

Referring to FIGS. 1A-1F, cross sections illustrating the steps for fabricating a chip package according to an embodiment of the invention are shown. As shown in FIG. 1A, first, a semiconductor wafer 100 containing a plurality of chips is provided. The semiconductor substrate 100 has a plurality of device areas 100A and a peripheral bonding pad area 100B disposed between any two adjacent device areas 100A. A plurality of conductive pads 104 is disposed at the peripheral bonding pad area 100B. Moreover, in general, the semiconductor wafer 100 is covered with a chip passivation layer 106 when it is produced from a semiconductor wafer factory. The chip passivation layer 106 may be a silicon nitride layer. Meanwhile, in order to electrically connect the devices of the chip to external circuits, the chip passivation layer 106 is defined by the semiconductor wafer factory to form a plurality of openings beforehand to expose conductive pads 104 therein.

Figure 1B:
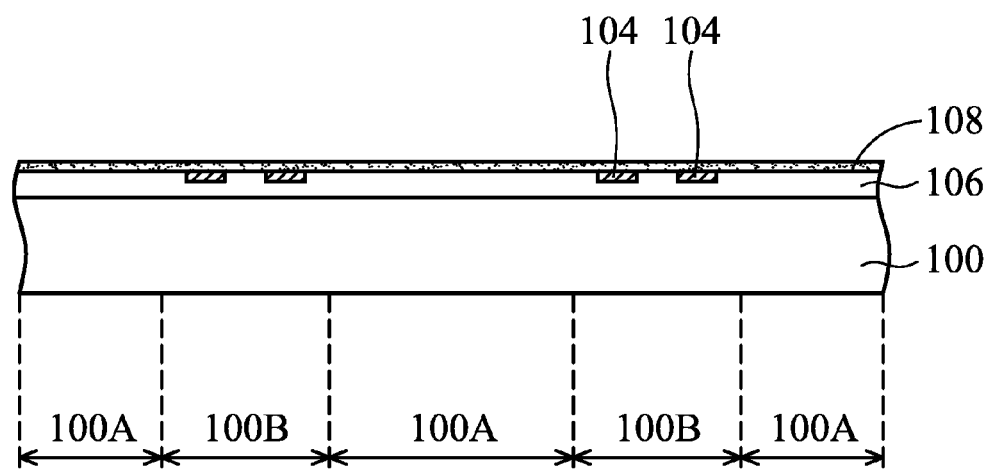

Next, referring to FIG. 1B, an insulating protective layer 108 is formed on the overall surface of the semiconductor wafer 100 to cover the chip passivation layer 106 and the conductive pads 104. The material of the insulating protective layer 108 is different from the material of the chip passivation layer 106. The insulating protective layer 108 may be a silicon oxide layer formed by a chemical vapor deposition method.

Figure 1C:
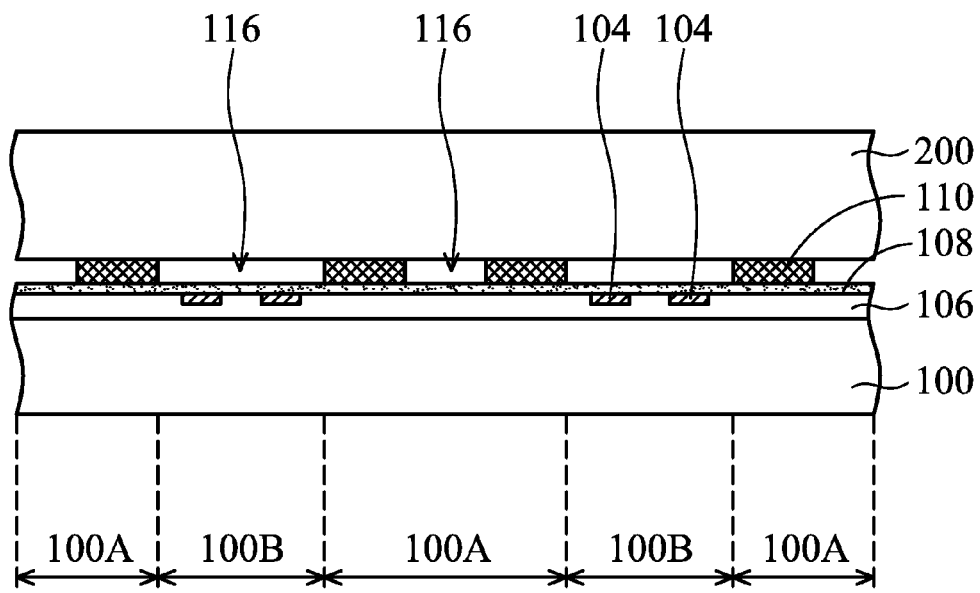

Then, referring to FIG. 1C, a packaging layer 200 is provided to bond with the semiconductor wafer 100. The packaging layer 200 may be a glass substrate or another blank silicon wafer. In an embodiment, the packaging layer 200 is separated from the semiconductor wafer 100 by a spacer 110 and thereby a cavity 116 surrounded by the spacer 110 is formed. The spacer 110 may be a sealant or a photosensitive insulating material, such as epoxy resin, solder mask materials, etc. Moreover, the spacer 110 may be firstly formed on the insulating protective layer 108 and then bonded to the packaging layer 200 through an adhesive layer (not shown). On the other hand, the spacer 110 may be firstly formed on the packaging layer 200 and then bonded to the insulating protective layer 108 through an adhesive layer (not shown).

Figure 1D:
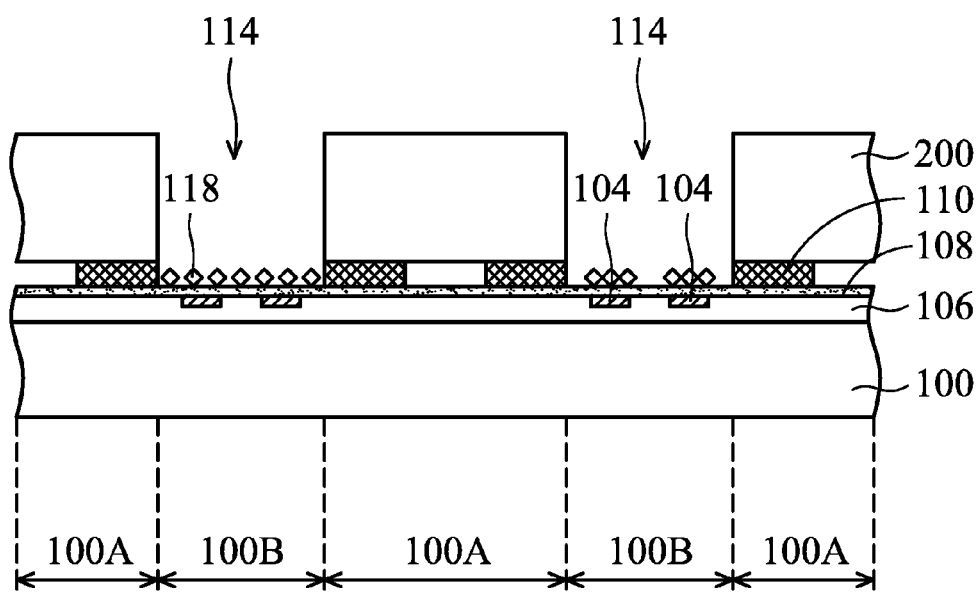

Referring to FIG. 1D, in a cutting process, a cutter knife (not shown) is used to form openings 114 in the packaging layer 200 to expose the surface of the peripheral bonding pad area 100B. Meanwhile, chipping 118, formed from the cutting process, for example glass or silicon wafer chipping, fall down onto the insulating protective layer 108. Because the conductive pads 104 are covered with the insulating protective layer 108, the conductive pads 104 are prevented from damage or scratching by the chipping 118 during the cutting process.

Figure 1E:
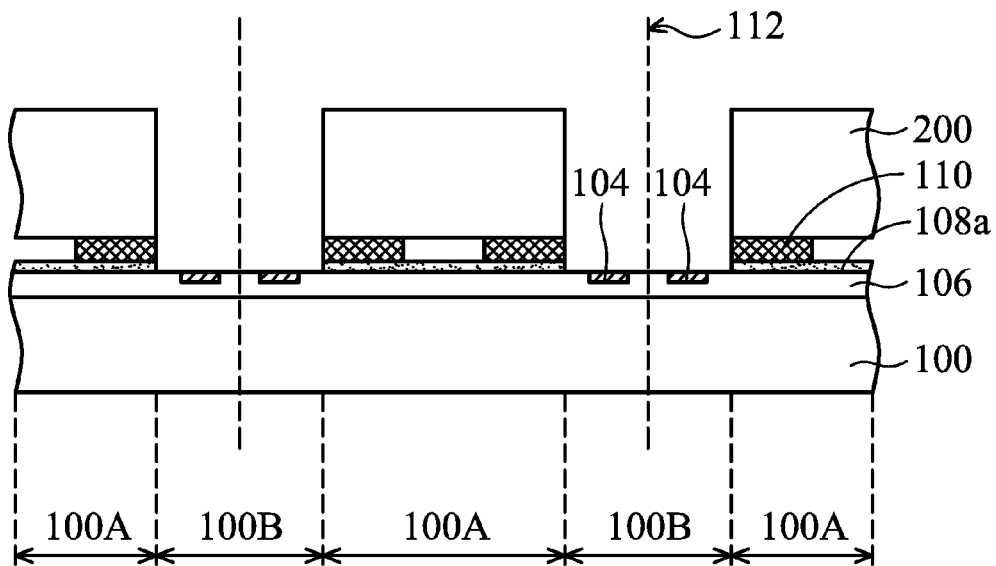

Next, referring to FIG. 1E, at least a portion of the insulating protective layer 108 at the peripheral bonding pad area 100B is removed through the openings 114 of the packaging layer 200. Thus, the conductive pads 104 and the chip passivation layer 106 are exposed to subsequently form electrical connections between the conductive pads 104 and external circuits. Meanwhile, the residual insulating protective layer 108 covers all of the device area 100A surrounded by the spacer 110. In the embodiment, the insulating protective layer 108 may be a non-photosensitive insulating material, such as silicon oxides. Accordingly, the packaging layer 200 having the openings 114 can be used as a hard mask, and the insulating protective layer 108 at the peripheral bonding pad area 100B can be removed by an etching process. Therefore, there is no need to use an extra photolithography process to form a patterned photoresist as a mask in the embodiment of the invention. Moreover, the material of the insulating protective layer 108 is different from the material of the chip passivation layer 106, such that the chip passivation layer 106 can be used as an etch stop layer for the insulating protective layer 108. In another embodiment, the insulating protective layer 108 at the peripheral bonding pad area 100B can be defined by a photolithography process to form openings to expose the conductive pads 104.

In addition, the insulating protective layer 108 can be selected from a photosensitive material and an exposure process is performed to the insulating protective layer 108. Then, a development process is performed to remove the insulating protective layer 108 at the peripheral bonding pad area 100B through the openings 114 of the packaging layer 200. In the embodiment, the material of the spacer 110 is an opaque material. A portion of the insulating protective layer 108a disposed under the spacer 110 is not exposed or an exposure extent thereof is smaller than other portions of the insulating protective layer, such that the portion of insulating protective layer 108a disposed under the spacer 110 has hardness which is greater than the hardness of other portions of the insulating protective layer 108a; for example the portions of the insulating protective layer 108a disposed under the cavity 116, which is exposed but not developed. Therefore, the mechanical strength of the structure below the spacer 110 is enhanced.

Moreover, because the adhesion between the spacer 110 and the material of silicon oxides is greater than the adhesion between the spacer 110 and the material of silicon nitrides, in the embodiments of the invention, the interface adhesion between the spacer 110 and the chip passivation layer 106 made of silicon nitrides is less than the interface adhesion between the spacer 110 and the insulating protective layer 108a made of silicon oxides. Thus, the extra insulating protective layer 108a formed from silicon oxide can improve reliability of chip packages.

Figure 1F:
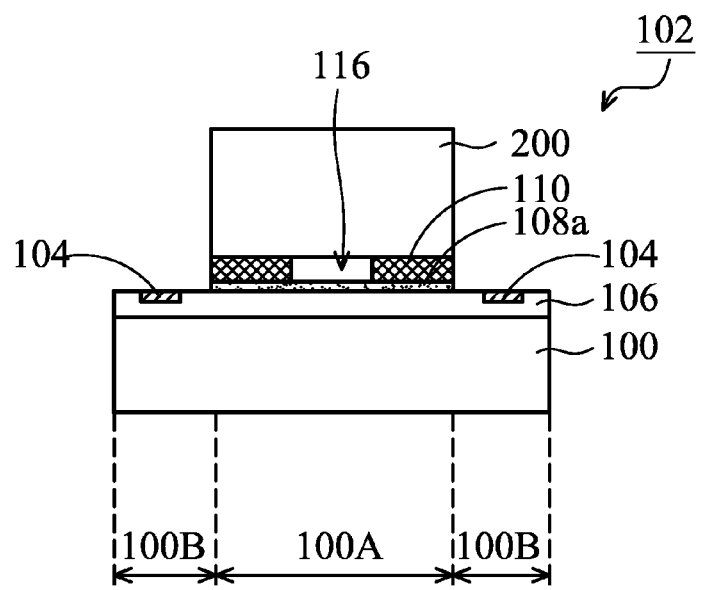

Next, referring to FIGS. 1E and 1F, the semiconductor wafer 100 is divided along a scribe line 112 at the peripheral bonding pad area 100B to form a plurality of separated independent chip packages as shown in FIG. 1F.

Referring to FIG. 1F, a cross section of a chip package according to an embodiment of the invention is shown. The semiconductor wafer is divided along the scribe line 112 to form the chip packages 102. The semiconductor substrate 100 of the chip package 102 is, for example formed from dicing the semiconductor wafer containing the chips. The semiconductor substrate 100 can be divided into the device area 100A and the peripheral bonding pad area 100B, wherein the device area 100A is surrounded by the peripheral bonding pad area 100B.

The peripheral bonding pad area 100B of the semiconductor substrate 100 has a plurality of conductive pads 104 thereon. The conductive pad 104 is, for example a bonding pad, which is electrically connected to the inner portion of the chip through metal interconnects (not shown). The surface of the semiconductor substrate 100 is covered with the chip passivation layer 106; for example a layer made of silicon nitrides or silicon oxynitrides. The conductive pads 104 are exposed by the chip passivation layer 106 and can be electrically connected to an external circuit by a wire bonding method. The chip passivation layer 106 disposed at the device area 100A is covered with the insulating protective layer 108a; for example a layer made of silicon oxides. In addition, the packaging layer 200 is further disposed on the insulating protective layer 108a.

In an embodiment, the chip packages can be applied to, but are not limited to, image sensor devices, such as complementary metal oxide semiconductor (CMOS) devices or charge-couple devices (CCD). Moreover, the chip packages can also be applied to micro electro mechanical system (MEMS) devices.

It is preferable that the conductive pads 104 are formed from copper (Cu), aluminum (Al) or other suitable metal materials. The spacer 110 can be disposed between the packaging layer 200 and the semiconductor substrate 100 to form the cavity 116 between the packaging layer 200 and the semiconductor substrate 100, wherein the cavity 116 is surrounded by the spacer 110.

In an embodiment, the packaging layer 200 may be a transparent substrate made of glass, quartz, opal, plastic or other materials permit light passing through. Moreover, a filter and/or an anti-reflective layer can be selectively formed on the packaging layer 200. In the embodiments of chip packages for non-photosensitive devices, the packaging layer 200 can be a semiconductor layer, for example a silicon covering layer.

Figure 2:
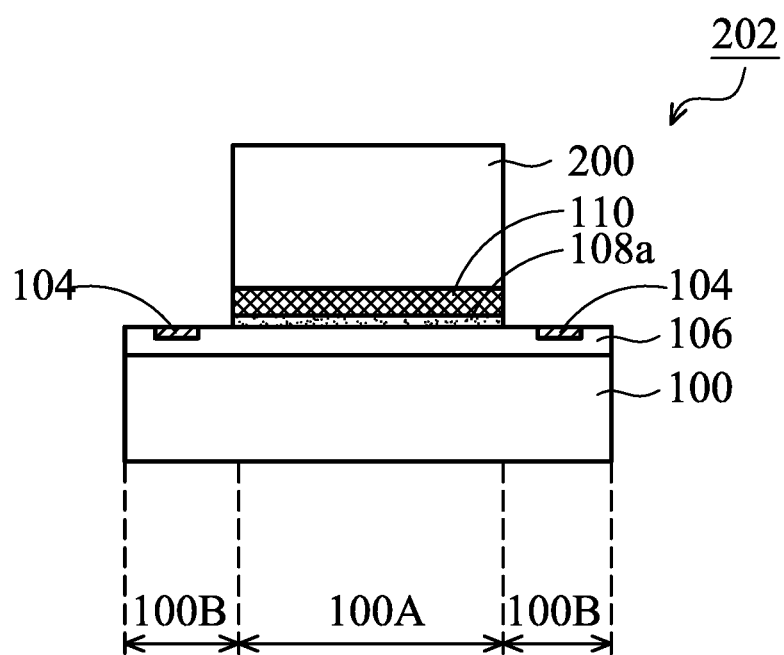
FIG. 2 is an illustrative cross section of a chip package according to another embodiment of the invention.

Referring to FIG. 2, a cross section of a chip package 202 according to another embodiment of the invention is shown. As shown in FIG. 2, the difference between the chip package 202 and the chip package 102 (FIG. 1F) is that the spacer 110 of the chip package 202 completely fills between the insulating protective layer 108a and the packaging layer 200, such that no cavity is formed between the insulating protective layer 108a and the packaging layer 200.

The spacer 110 can be made of epoxy resin, a solder mask or other suitable insulating materials.

According to an embodiment of the invention, the insulating protective layer is formed on the conductive pads during the cutting process for wafer scale packages, thus the conductive pads can be prevented from damage and scratching by the chipping formed from the cutting process. Moreover, in the subsequent process for removing the insulating protective layer, the packaging layer with openings formed by the cutting process can be used as a hard mask, such that there is no need to form an extra patterned photoresist to serve as a mask.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A chip package, comprising:
   a semiconductor substrate, having a device area and a peripheral bonding pad area, wherein the peripheral bonding pad area surrounds the device area;
   a plurality of conductive pads disposed at the peripheral bonding pad area of the semiconductor substrate;
   a chip passivation layer disposed over the semiconductor substrate, wherein the conductive pads are embedded in the chip passivation layer and are exposed by the chip passivation layer;
   an insulating protective layer disposed over the device area, wherein the insulating protective layer covers the device area, not reaching to the peripheral bonding pad area;
   a packaging layer disposed on the insulating protective layer, wherein the conductive pads and the chip passivation layer at the peripheral bonding pad area are exposed by the packaging layer; and
   a spacer completely filling between the packaging layer and the insulating protective layer, wherein a sidewall of the insulating protective layer is coplanar with a sidewall of the spacer, and a portion of the insulating protective layer is sandwiched between the spacer and the chip passivation layer.

2. The chip device package as claimed in claim 1, wherein a material of the insulating protective layer is different from a material of the chip passivation layer.

3. The chip package as claimed in claim 2, wherein the packaging layer comprises a transparent substrate or a semiconductor substrate.

4. The chip device package as claimed in claim 1, wherein the sidewall of the insulating protective layer is coplanar with a sidewall of the packaging layer.

5. The chip device package as claimed in claim 1, wherein the conductive pads are separated from the insulating protective layer without overlapping the insulating protective layer.

6. The chip device package as claimed in claim 1, wherein the insulating protective layer and the spacer are spaced apart from one of the conductive pads by the same distance.

7. A chip package, comprising:
   a semiconductor substrate, having a device area and a peripheral bonding pad area, wherein the peripheral bonding pad area surrounds the device area;
   a plurality of conductive pads disposed at the peripheral bonding pad area of the semiconductor substrate;
   a chip passivation layer disposed over the semiconductor substrate, wherein the conductive pads are embedded in the chip passivation layer and are exposed by the chip passivation layer;
   an insulating protective layer disposed over the device area, wherein the insulating protective layer covers the device area, not reaching to the peripheral bonding pad area;
   a packaging layer disposed on the insulating protective layer and exposing the conductive pads, wherein the insulating protective layer completely covers a surface of the chip passivation layer overlapping the packaging layer, and a sidewall of the insulating protective layer is coplanar with a sidewall of the packaging layer; and
   a spacer completely filling between the packaging layer and the insulating protective layer, wherein a portion of the insulating protective layer is sandwiched between the spacer and the chip passivation layer.

8. The chip package as claimed in claim 7, wherein the conductive pads and the chip passivation layer at the peripheral bonding pad area are exposed by the packaging layer.

9. The chip device package as claimed in claim 7, wherein a material of the insulating protective layer is different from a material of the chip passivation layer.

10. The chip package as claimed in claim 9, wherein the packaging layer comprises a transparent substrate or a semiconductor substrate.

11. The chip device package as claimed in claim 7, wherein the sidewall of the insulating protective layer is coplanar with a sidewall of the spacer.

12. The chip device package as claimed in claim 7, wherein the conductive pads are separated from the insulating protective layer without overlapping the insulating protective layer.

13. The chip device package as claimed in claim 7, wherein the insulating protective layer and the spacer are spaced apart from one of the conductive pads by the same distance.

* * * * *